US011063088B2

(12) United States Patent
Ouellette et al.

(10) Patent No.: US 11,063,088 B2
(45) Date of Patent: Jul. 13, 2021

(54) MAGNETIC MEMORY DEVICES AND METHODS OF FABRICATION

(71) Applicant: Intel Corporation, Santa Clara, CA (US)

(72) Inventors: Daniel Ouellette, Portland, OR (US); Christopher Wiegand, Portland, OR (US); Justin Brockman, Portland, OR (US); Tofizur Rahman, Portland, OR (US); Oleg Golonzka, Beaverton, OR (US); Angeline Smith, Hillsboro, OR (US); Andrew Smith, Hillsboro, OR (US); James Pellegren, Portland, OR (US); Aaron Littlejohn, Portland, OR (US); Juan G. Alzate-Vinasco, Tigard, OR (US); Yu-Jin Chen, Hillsboro, OR (US); Tanmoy Pramanik, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/706,470

(22) Filed: Dec. 6, 2019

(65) Prior Publication Data

US 2021/0175284 A1    Jun. 10, 2021

(51) Int. Cl.
| | |
|---|---|
| *H01L 27/22* | (2006.01) |
| *H01L 43/02* | (2006.01) |
| *G11C 11/16* | (2006.01) |
| *H01L 43/10* | (2006.01) |
| *H01F 10/32* | (2006.01) |
| *H01F 41/32* | (2006.01) |
| *H01L 43/12* | (2006.01) |

(52) U.S. Cl.
CPC ......... *H01L 27/228* (2013.01); *G11C 11/161* (2013.01); *H01F 10/329* (2013.01); *H01F 10/3259* (2013.01); *H01F 10/3286* (2013.01); *H01F 41/32* (2013.01); *H01L 43/02* (2013.01); *H01L 43/10* (2013.01); *H01L 43/12* (2013.01)

(58) Field of Classification Search
CPC ... H01L 27/228; H01F 10/329; H01F 10/3286
See application file for complete search history.

(56) References Cited

U.S. PATENT DOCUMENTS

| | | | | |
|---|---|---|---|---|
| 9,349,945 | B2* | 5/2016 | Sandhu | H01L 43/08 |
| 10,224,367 | B2* | 3/2019 | Yang | H01L 27/2481 |
| 10,854,252 | B2* | 12/2020 | Nagase | H01L 27/224 |
| 2020/0006635 | A1* | 1/2020 | Rahman | H01L 27/228 |
| 2020/0105998 | A1* | 4/2020 | Smith | G11C 11/1675 |
| 2020/0313084 | A1* | 10/2020 | Ouellette | H01L 43/12 |
| 2020/0343300 | A1* | 10/2020 | Aggarwal | G11C 11/161 |

* cited by examiner

*Primary Examiner* — William Coleman
(74) *Attorney, Agent, or Firm* — Green, Howard & Mughal LLP

(57) ABSTRACT

A memory device includes a first electrode, a second electrode and a magnetic tunnel junction (MTJ) between the first electrode and the second electrode. The MTJ includes a fixed magnet, a free magnet and a tunnel barrier between the fixed magnet and the free magnet. The MTJ further includes a conductive layer between the free magnet and the second electrode, the conductive layer having a metallic dopant, where the metallic dopant has a concentration that increase with distance from an interface between the free magnet and the conductive layer. A capping layer is between the conductive layer and the second electrode.

22 Claims, 11 Drawing Sheets

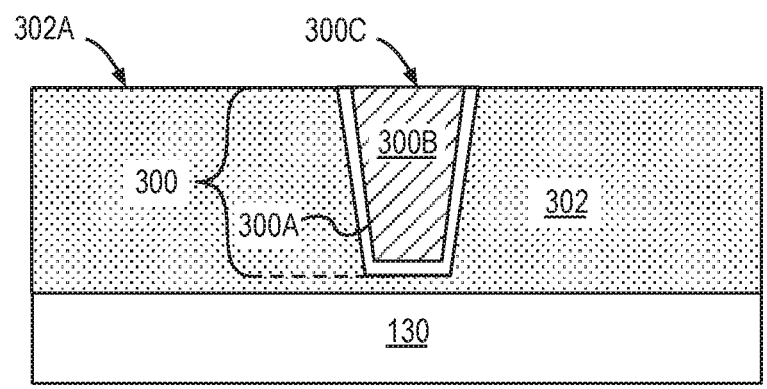
FIG. 3
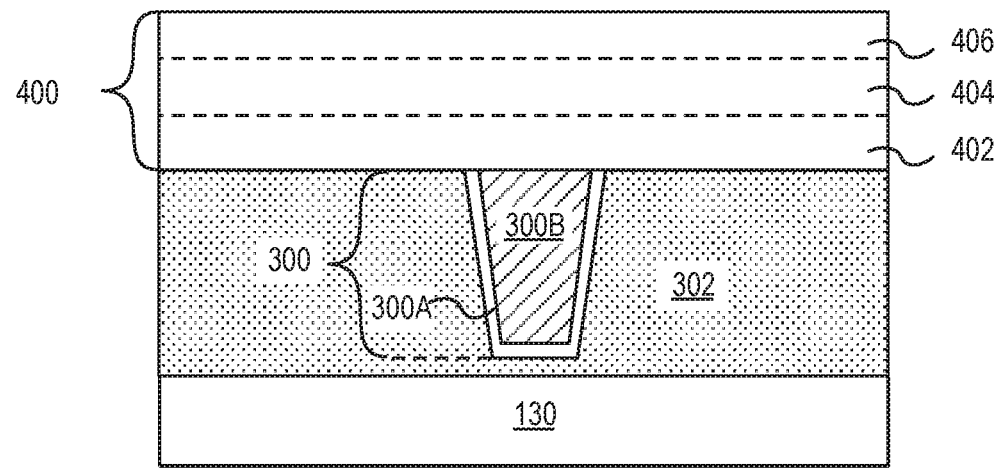
FIG. 4
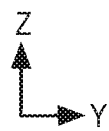

MAGNETIC MEMORY DEVICES AND METHODS OF FABRICATION

BACKGROUND

For the past several decades, feature size reduction has been a key focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. One such example is non-volatile memory based on a perpendicular magnetic tunnel junction (pMTJ).

Non-volatile embedded memory device with pMTJ, e.g., on-chip embedded memory with non-volatility can enable energy and computational efficiency. However, the technical challenges of assembling a pMTJ stack to form functional devices present formidable roadblocks to commercialization of this technology today. Specifically, increasing switching efficiency by reducing electrical resistance in the pMTJ stack is one of the challenges in formation of a viable pMTJ based memory device.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 3 illustrates a conductive interconnect formed above a substrate.

FIG. 4 illustrates the structure of FIG. 3 following the formation of an electrode structure including the electrode layer, buffer layer on the electrode layer, and a seed layer on the buffer layer, in accordance with an embodiment of the present disclosure.

DESCRIPTION OF THE EMBODIMENTS

Figure 1A:
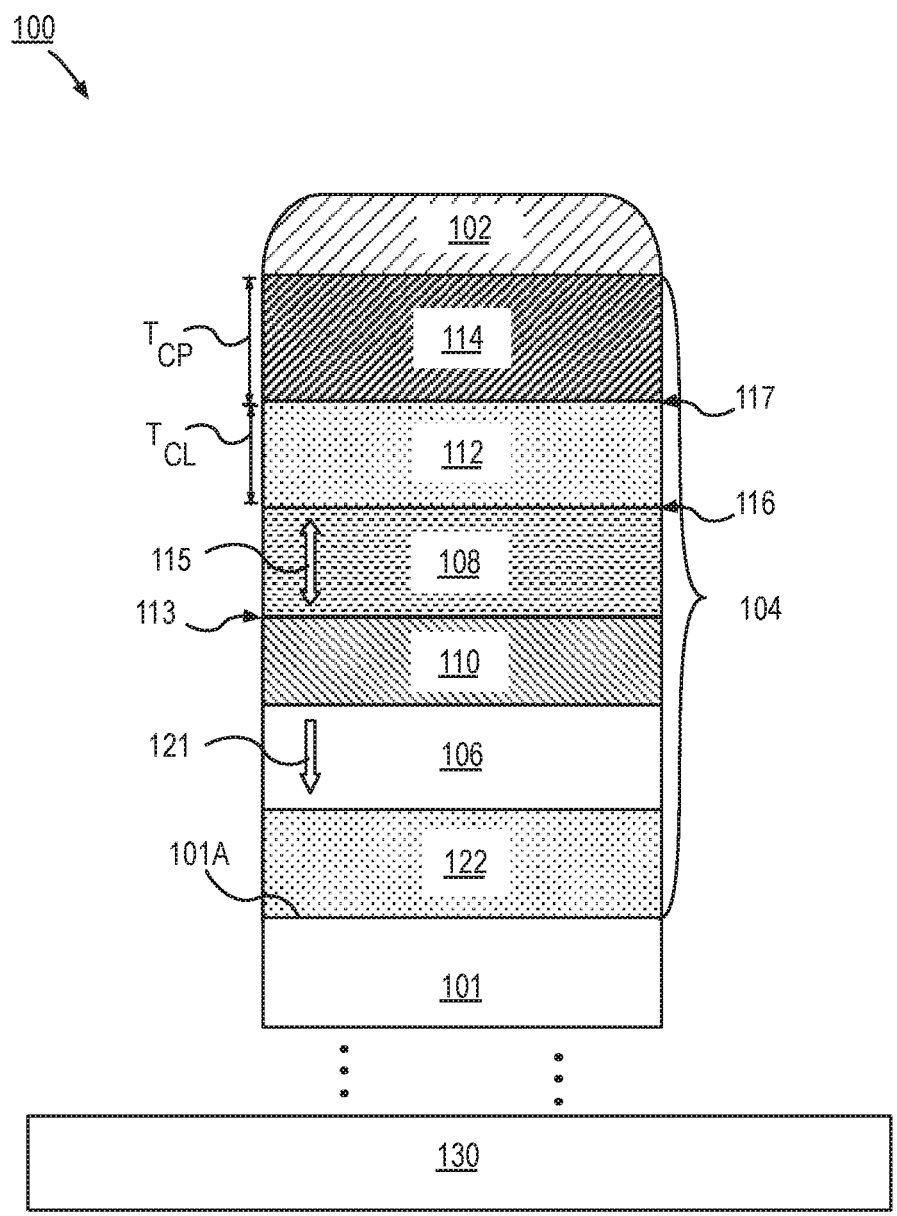
FIG. 1A illustrates a cross-sectional view of a memory device, in accordance with an embodiment of the present disclosure.

A perpendicular-MTJ (pMTJ) device with a graded composition storage layer capping scheme is described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

An MTJ device functions as a memory device where the resistance of the MTJ device switches between a high resistance state and a low resistance state. The resistance state of an MTJ device is defined by the relative orientation of magnetizations between a free magnet and a fixed magnet, that is separated from the free magnet by a tunnel barrier. When magnetizations of the free magnet and the fixed magnet have orientations that are in the same direction, the MTJ device is said to be in a low resistance state. Conversely, when the magnetization of the free magnet and the magnetization of the fixed magnet are oriented in an opposite direction to each other, the MTJ device is said to be in a high resistance state.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a horizontal plane of the free magnet. Resistance switching is brought about in a pMTJ device by passing a threshold spin polarized current through the pMTJ device so as to influence the orientation of the magnetization of the free magnet, aligning it with or against, the magnetization of the fixed magnet. The act of influencing the magnetization in the free magnet is brought about by a phenomenon known as spin torque transfer, where torque from the spin polarized current (from fixed magnet) is imparted to the magnetization of the free magnet. By changing the direction of the spin polarized current through the pMTJ, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when no current flows through the pMTJ device. For this reason, the pMTJ device belongs to a class of memory known as non-volatile memory.

A free magnet in pMTJ device may include a single layer or a multilayer stack having a layer of non-magnetic material between a pair of layers including magnetic materials to increase thermal stability and improve retention characteristics for functionality as a memory device. To an extent, thermal stability of a pMTJ device depends on the strength of the perpendicular anisotropy of the free magnetic layers in the pMTJ material layer stack. Strength of perpendicular anisotropy depends on the quality and size (volume) of the one or more free magnets, to an extent on the number and quality of interfaces between magnetic and non-magnetic layers in the free magnet and layers that directly interface with the free magnet. While a pMTJ stack may be engineered to increase perpendicular interfacial anisotropy and thermal stability, there may be degradation in switching efficiency in the pMTJ device. Switching efficiency of a free magnet may be defined as the ratio between thermal activation barrier height, $E_b$, in free magnetic layer and the threshold switching current, $I_{c0}$. From a practical standpoint, switching efficiency may be defined as the magnitude and duration of switching voltage or current pulse required to write a memory bit with a given tunnel barrier electrical resistance and a given thermal stability. Switching efficiency may depend on polarity of switching voltage.

Increasing switching efficiency and switching speed (greater than microsecond) of a pMTJ is important for cache memory applications, or for embedded dynamic random-access memory (EDRAM). To replace static random-access memory (SRAM) in an integrated circuit, a pMTJ requires a switching speed of approximately nanoseconds or lower. Increasing switching efficiency and switching speed of a pMTJ also reduces write energy. Reducing write energy of a memory device enables reduction in integrated circuit power consumption when pMTJ devices are coupled with low power logic transistors. For example, CMOS logic transistors may operate at sub 1V $V_{CC}$ can be considered as low power transistors.

Switching speed and reliability of pMTJ devices may be limited by bulk and interface properties of the materials in proximity to the free magnet. To preserve interfacial perpendicular magnetic anisotropy and thermal stability a free magnet may be capped by a dielectric material. In some examples where the free magnet includes iron and one or more of cobalt or boron, the free magnet may be capped by a dielectric including magnesium and oxygen. Preserving interfacial anisotropy can improve switching efficiency of the pMTJ device. However, a dielectric including magnesium and oxygen, such as MgO, can present some drawbacks. In a pMTJ device, the MgO may be an intervening capping layer between the free magnet an electrode material, where the electrode material is in further contact with a terminal which is coupled to a voltage source. Use of a dielectric such as MgO as a capping layer increases an electrical resistance in the pMTJ device. Any added electrical resistance translates to a need for a greater operating voltage to transmit a given current through the pMTJ. Additionally, MgO capping layers may promote metastable states which can result in write errors for nanosecond-scale write pulses during pMTJ operation. Such metastable states may be a result of defects in a crystal structure of the free magnet or due to inhomogeneity in the free magnet-MgO interface. Thus, preserving interfacial anisotropy, reducing electrical resistance and improving switching efficiency need to be balanced to avail a large array of functional pMTJ devices for practical applications.

One way to reduce electrical resistance is to replace the dielectric cap with a capping electrode including a material having a mid to high Z (atomic mass). A mid to high Z material may include one or more species having an atomic number greater than for example Z=39. When spin polarized electrons are transmitted through the free magnet, they interact with the atoms of the mid to high Z material. A directly adjacent conductive layer including the mid to high Z material can lead to magnetic damping in the free magnet. Because switching speed is proportional to magnetic damping, it is highly desirable to reduce magnetic damping. Damping effects are determined primarily by spin pumping effects which occur when ferromagnetically ordered spins in a free magnet come into proximity with materials having high spin-orbit coupling—particularly metals with Z greater than or equal to 39. However, these high damping materials are often desirable or necessary as electrode or hard mask layers, in part because of their resistance to detrimental diffusion effects during high temperature back-end-of-line (BEOL) processing.

To reduce damping, preserve interfacial anisotropy and guard against diffusion, the inventors have determined that a graded layer may be inserted between the free magnet and the electrode. The graded layer may include similar materials as the free magnet and further include a dopant species having Z equal to or greater than 39. The dopant species may include, for example, materials with intermediate Z such as molybdenum or higher Z such as tantalum or tungsten. The graded layer is non-magnetic but may include magnetic materials to provide a gradual transition between the free magnet and material of the capping electrode. In some embodiments, a bulk or majority of the graded layer may include substantially the same material as the material of the free magnet itself. However, in such examples, the graded layer is not magnetic because of the dopant species (e.g., Ta, W, or Mo). A non-magnetic graded layer reduces magnetic damping in the free magnet relative to the presence of a material that provides an abrupt interface between the switching layer and capping electrode. The degree of magnetic damping in the free magnet is determined by the amount of dopant/capping electrode material accessible to ordered spins. The graded layer provides separation between the magnetically active layer and the capping electrode to lower effects of damping. The graded layer may be doped at a very low concentration level directly adjacent to the free magnet to avoid an abrupt interface.

The inventors have determined that pMTJ devices based on free magnets including Co, Fe and B capped by a graded layer based on a mixture of Co, Fe, B and a dopant may help to increase efficiency, lower fast switching errors and reduced short-circuit mode fixed bit failures compared to pMTJ including a MgO dielectric between a Co, Fe and B-based free magnet and high or intermediate Z capping electrode.

In accordance with an embodiment of the present disclosure, a memory device includes a first electrode, a second electrode and a magnetic tunnel junction (MTJ) between the first electrode and the second electrode. The MTJ includes a fixed magnet, a free magnet and a tunnel barrier between the fixed magnet and the free magnet. The MTJ further includes a conductive layer between the free magnet and the second electrode, the conductive layer having a metallic dopant, where the metallic dopant has a concentration that increase with distance from an interface between the free magnet and the conductive layer. A capping layer is between the conductive layer and the second electrode.

In some embodiments, the memory device further includes a synthetic antiferromagnet structure directly adjacent to the fixed magnet opposite to the tunnel barrier. In other embodiments, the first or the second electrode includes a plurality of layers that are lattice matched with the fixed magnet.

FIG. 1A is an illustration of a cross-sectional view of a memory device 100 in accordance with an embodiment of the present disclosure. The memory device 100 includes an electrode 101, an electrode 102 above electrode 101 and a magnetic tunnel junction (MTJ) 104 between the electrode 101 and the electrode 102. The MTJ 104 includes a magnet 106, a magnet 108 and a tunnel barrier 110 between the magnet 106 and the magnet 108. The MTJ 104 further includes a conductive layer 112 between the free magnet 108 and the electrode 102, where the conductive layer 112 includes a metallic dopant. The metallic dopant has a concentration that increases with distance from an interface 113 between the magnet 108 and the conductive layer 112. A capping layer 114 is between the conductive layer 112 and the electrode 102.

The magnet 108 has a magnetization 115 that may change orientation during operation. Such a magnet 108 is herein referred to as a free magnet 108. For example, magnetization 115 may orient in the positive or negative Z-direction as indicated by the bi-directional arrow. The direction of magnetization 115 is perpendicular to a plane of an uppermost surface 101A of the electrode 101. The free magnet 108, having a magnetization 115 that is perpendicular to the plane of the uppermost surface 101A, may also be known as a perpendicular free magnet 108. In an embodiment, the free magnet 108 includes magnetic materials and has a thickness for sufficiently perpendicular magnetization. In the illustrative embodiment, the free magnet 108 includes a magnetic material such as Co, Ni, Fe or alloys of these materials. In an embodiment, the free magnet 108 includes a magnetic material such as CoB, FeB, CoFe or CoFeB. In some embodiments, the free magnet 108 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 108 is FeB, where the concentration of boron is between 10 and 40 atomic percent of the total composition of the FeB alloy. In an embodiment, free magnet 108 has a thickness between 1 nm and 1.5 nm.

In an embodiment, the conductive layer 112 includes iron, and one or more of cobalt or boron and the metallic dopant. In an embodiment, the conductive layer 112 includes a Co, Fe B and a dopant D having a chemical composition, $CoFeB_{1-x}D_x$, where X is the atomic percent of the dopant. The presence of the metallic dopant in the CoFeB material ensures that the conductive layer 112 is non-magnetic. Depending on embodiments, the metallic dopant includes tungsten, molybdenum or tantalum. As discussed above, to avoid an abrupt interface 116 between the free magnet 108 and the conductive layer 112, the metallic dopant is at a very low concentration level directly adjacent to the free magnet 108. The metallic dopant is at a concentration that sufficiently ensures that the conductive layer 112 is non-magnetic for each of the dopant species utilized. In exemplary embodiments, when the conductive layer 112 includes CoFeB, a dopant concentration of least 30 atomic percent ensures that the conductive layer 112 is non-magnetic.

A portion of the conductive layer that is directly adjacent to the free magnet 108 has a crystal texture that is substantially similar to the free magnet 108. In an embodiment, the conductive layer 112 has a BCC (001) crystal texture and the free magnet 108 has a BCC (001) crystal structure.

Figure 1B:
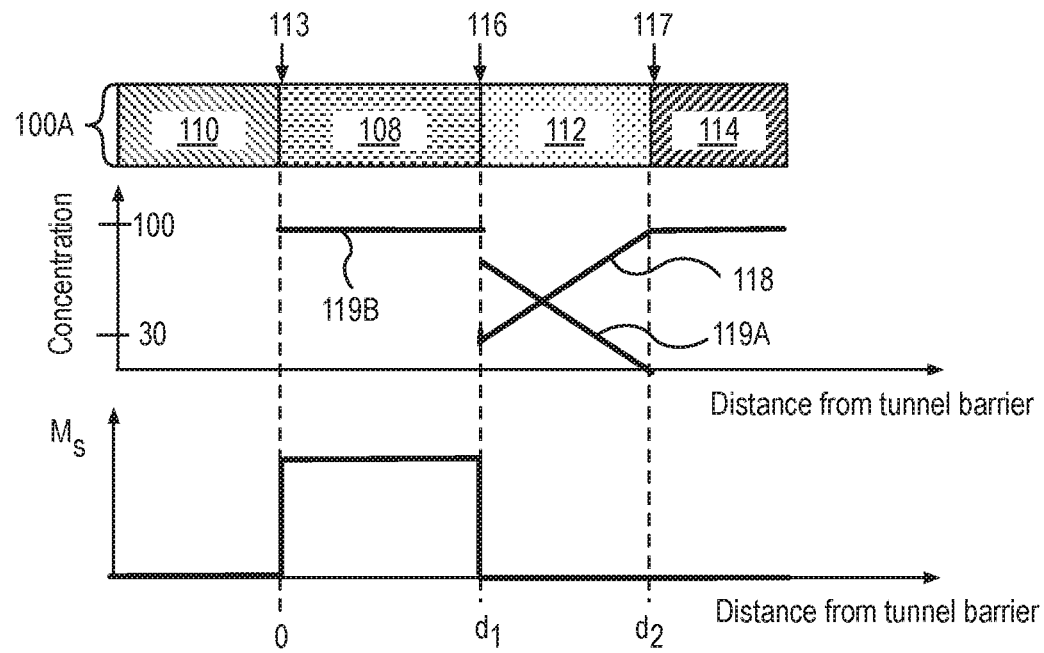
FIG. 1B illustrates a first plot of material concentration in portions of the memory device versus distance from tunnel barrier and a first plot of saturation magnetization in portions of the memory device versus distance from tunnel barrier.

Distributions of the dopant within the conductive layer 112 spanning from interface 116 to interface 117 between the conductive layer 112 and the capping layer 114 is illustrated in FIG. 1B. A portion 100A of the memory device 100 is illustrated to provide visual co-relation between the material composition and the various layers such as the free magnet 108 the conductive layer 112 and the capping layer 114. In an exemplary embodiment, the conductive layer 112 includes $(Co_{100-A-Z}Fe_AB_Z)_YD_X$, where X and Y vary as shown in the plot. The dopant concentration, $D_X$, indicated by line 118, is plotted as function of distance from interface 116. The concentration of the $Co_{100-A-Z}Fe_AB_Z$ material, indicated by line 119, is plotted as function of distance from interface 116 in the conductive layer 112.

As shown X starts at a finite value at interface 116, a distance $d_1$ from interface 113, and gradually increases over a thickness of the conductive layer 112. In exemplary embodiments, X is at least 30 atomic percent at interface 116 between the free magnet 108 and the conductive layer 112. In some embodiments, as shown, the metallic dopant concentration X reaches a maximum of 100 atomic percent at interface 117 between the conductive layer 112 and the capping layer 114, a distance $d_2$ away from the tunnel barrier 110. In other embodiments, the metallic dopant concentration X varies by at least 30 atomic percent between interfaces 116 and 117, where the lower concentration is in the vicinity of interface 116 and a higher concentration is in the vicinity of interface 117.

As shown at interface 116, the conductive layer 112 is predominantly $Co_{100-A-Z}Fe_AB_Z$ as indicated by line 119A and the dopant concentration is less than a concentration of the $Co_{100-A-Z}Fe_AB_Z$ material. As X increases along the thickness of the conductive layer 112 (measured by difference between $d_1$ and $d_2$), concentration of the $Co_{100-A-Z}Fe_AB_Z$ material decreases. In embodiments where X reaches 100 atomic percent at interface 117, Y reaches 0 atomic percent at interface 117, as is shown in the plot.

In the illustrative embodiment, where the free magnet 108 includes a $Co_{100-A-Z}Fe_AB_Z$ material, where A is between 50 and 80 atomic percent and Z is between 10 and 40 atomic percent. In the illustrative embodiment, free magnet 108 includes a $Co_{100-A-Z}Fe_AB_Z$, where A and where A is between 50 and 80 atomic percent and Z is between 10 and 40 atomic percent. In one embodiment, the conductive layer 112 comprises iron, cobalt and boron and the free magnet 108 comprises cobalt, iron and boron, wherein the atomic percent of the cobalt, iron and boron in the free magnet 108 is substantially the same as the atomic percent of cobalt, iron and boron in the conductive layer 112.

Capping layer 114 provides protection against iron or oxygen diffusion into the free magnet during the fabrication process. In an embodiment, the capping layer 114 includes one or more of tantalum, molybdenum or tungsten. In the illustrative embodiment, the capping layer 114 includes a same metal as a metal of the dopant species in the conductive layer 112. As shown, the concentration of the dopant species in the conductive layer 112 reaches a 100 atomic percent at interface 117 between the conductive layer 112 and the capping layer 114.

The extent of magnetization of a magnetic material is called saturation magnetization, $M_S$. FIG. 1B also includes a plot of $M_S$ versus distance from the interface 113. Only the free magnet 108 has a magnetization, $M_S$. As shown, $M_S$ is substantially uniform across a thickness (distance $d_1$ from interface 113) of the free magnet 108. The conductive layer 112 is not magnetized due to a sufficient presence of the dopant species. The capping layer 114 is not intrinsically magnetic.

In the illustrative embodiment, the free magnet 108 does not include any dopant species. As shown a relative concentration of the Co, Fe and B remains substantially uniform across a thickness (distance $d_1$ from interface 113) of the free magnet 108 as illustrated by line 119B. In other embodiments, a free magnet 108 also includes a dopant species, but has perpendicular magnetic anisotropy. The dopant concentration is between 5-20 atomic percent.

Figure 1C:
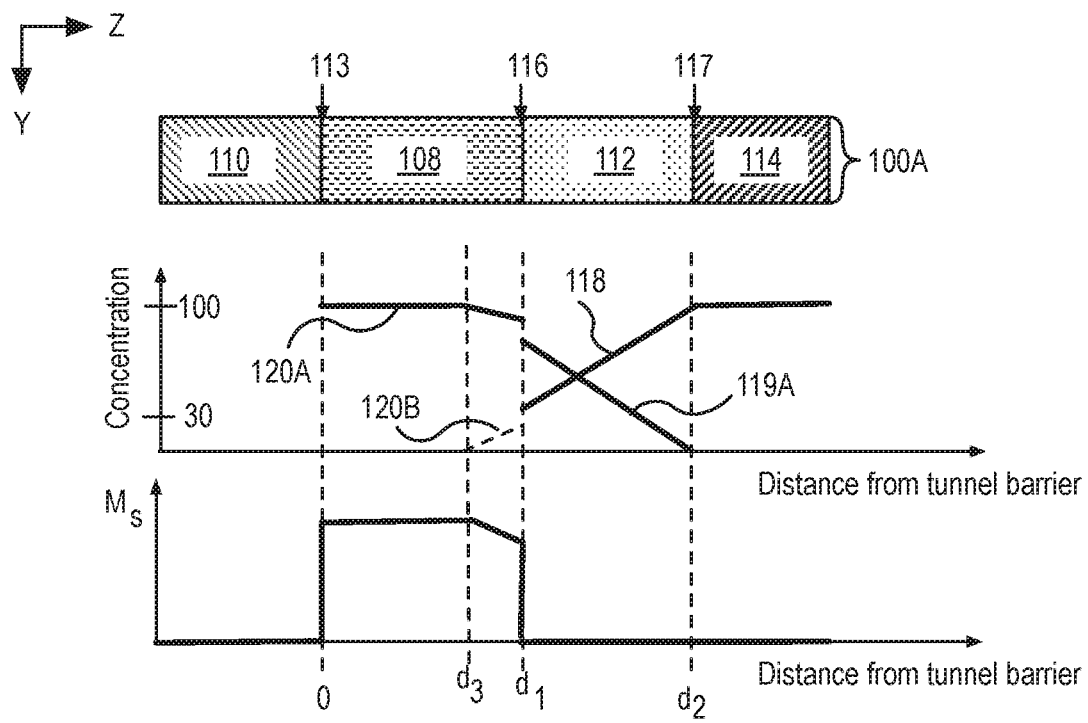
FIG. 1C illustrates a second plot of material concentration in portions of the memory device versus distance from tunnel barrier and a second plot of saturation magnetization in portions of the memory device versus distance from tunnel barrier.

A plot of dopant concentration versus distance from the tunnel barrier 110 is plotted in FIG. 1C. In the illustrative embodiment, the free magnet 108 includes Co, Fe and B and a dopant species. As shown the dopant species is primarily confined to a portion of the free magnet 108 in the vicinity of the interface 116. In an embodiment, the dopant species includes Ta, W or Mo. The dopant species in the free magnet 108 may or may not be the same dopant species in the conductive layer 112. In the illustrative example, the dopant species in the free magnet 108 is the same as dopant species in the conductive layer 112. In an embodiment, when the dopant species includes Ta, W or Mo, the free magnet 108 has a dopant concentration that is at most 20 percent. In the illustrative plot, the atomic percent of CoFeB in the free magnet 108 gradually decreases towards interface 116 in inverse proportion to an increase in the atomic percent of the dopant species towards the same interface 116, as indicated by lines 120A and 120B respectively. The dopant species may be confined to a spatial extent in the free magnet 108 away from interface 116 that depends primarily on a thickness of the free magnet 108. In embodiments where the free magnet 108 has a thickness of 2.5 nm or less, the dopant species spans a thickness (defined by difference in $d_3$ and $d_1$) of less than 10% of the thickness of the free magnet 108.

A free magnet 108 including a dopant concentration of at most 20 atomic percent may be sufficiently magnetic as illustrated by a plot of the saturation magnetization versus distance from the tunnel barrier 110 illustrated in FIG. 1C. The dopant may reduce the saturation magnetization, $M_S$, of the free magnet 108 near the vicinity of the interface 116 between $d_3$ and $d_1$, as shown. In some embodiments, $M_S$ reduction may improve perpendicular magnetic anisotropy when free magnet 108 is thick such as above 2 nm. A thick free magnet 108 above 2 nm may be advantageous for yield, thermal budget, and variability. However, a maximum dopant concentration of 20% is sufficiently low to prevent appreciable loss of perpendicular magnetic anisotropy in the free magnet 108 and does not render the free magnet 108 to have an in-plane magnetic anisotropy. A dopant concentration of less than 20% may also minimize damping effects in the free magnet 108. The distribution of the dopant species may vary in different embodiments. In some embodiments, the dopant species may be uniformly distributed throughout an entire volume of the free magnet 108.

Referring again to FIG. 1A, in an embodiment, the conductive layer 112 has a thickness, TCL, as measured from the interface 116 between the free magnet 108 and the conductive layer, 112, that is between 0.8 nm and 25 nm. In exemplary embodiments, the thickness is between 0.8 nm and 5 nm. In some applications, $T_{CL}$ is between 10 nm and 25 nm. In an embodiment, the capping layer 114 has a $T_{CP}$, as measured from the interface 117 between the capping layer 114 and the conductive layer 112, that is between 2 nm and 10 nm. In an embodiment, the free magnet 108 has a vertical thickness, TFM, as measured from an interface 113 between the free magnet 108 and the tunnel barrier 110, that is between 0.8 nm and 2.5 nm.

The magnet 106 has a magnetization 121 that remains fixed during operation. Such a magnet 106 is herein referred to as a fixed magnet 106. For example, magnetization 121 may remain substantially fixed in a positive or in a negative Z-direction. In the illustrative embodiment, the magnetization 121 is directed toward a negative Z direction. The direction of magnetization 121 is perpendicular to a plane of an uppermost surface 101A of the electrode 101. The fixed magnet 106 having a magnetization 121 that is perpendicular to the plane of the uppermost surface 101A may also be known as a perpendicular fixed magnet 106. When the free magnet 108 and fixed magnet 106 have perpendicular magnetic anisotropy, the MTJ 104 is known as a perpendicular MTJ (pMTJ) 104.

The chemical composition of the magnet 106 may vary depending on the embodiment. In an embodiment, the fixed magnet 106 includes magnetic materials and has a thickness for sufficiently perpendicular magnetization. In an embodiment, the magnet 106 of the MTJ 104 can include alloys such as CoFe, CoFeB, FeB. The alloys of CoFe, CoFeB, FeB may include doping with one or more of Ta, Hf, Mo, Ir, Ru, Si or C, to promote high perpendicular anisotropy. In an embodiment, the magnet 106 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the magnet 106 is FeB, where the concentration of boron is between 10-40 atomic percent of the total composition of the FeB alloy.

When the magnetization 115 is oriented parallel to magnetization 121 the memory device 100 is in a low electrical resistance state. When the magnetization 115 is oriented anti-parallel to magnetization 121 the memory device 100 is in a high electrical resistance state relative to the low electrical resistance state. The difference in electrical resistance between the high and low states ranges between 2 KOhm and 10 KOhm.

In an embodiment, an injected spin polarized current that changes the direction of the magnetization 115 in the free magnet 108 can also affect the magnetization 121 of the fixed magnet 106. In an embodiment, to prevent accidental flipping of the fixed magnet 106 during spin transfer torque switching, the fixed magnet 106 has a higher magnetic anisotropy than the free magnet 108. In another embodiment, as illustrated in FIG. 1A, memory device 100 includes a synthetic antiferromagnetic (SAF) structure 118 between the bottom electrode 101 and the fixed magnet 106. The SAF structure 118 may be anti-ferromagnetically coupled with the fixed magnet 106 but not adversely affect free magnet 108 by minimizing the stray field effects at the location of the free magnet 108.

Figure 1D:
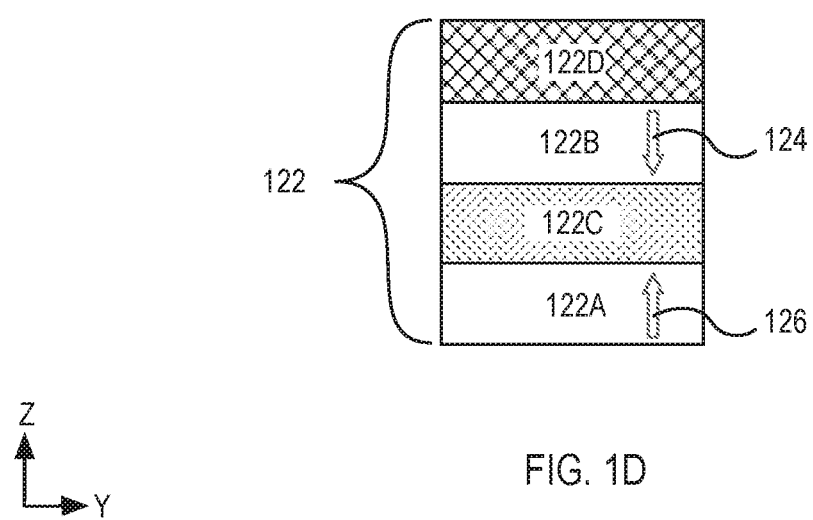
FIG. 1D illustrates a synthetic antiferromagnet structure, in accordance with an embodiment of the present disclosure.

FIG. 1D illustrates cross-sectional view of the SAF structure 122 in an accordance of an embodiment of the present disclosure. In an embodiment, the SAF structure 122 includes a first pinning ferromagnet 122A and a second pinning ferromagnet 122B and a spacer layer 122C sandwiched between a first pinning ferromagnet 122A and the second pinning ferromagnet 122B. The pinning ferromagnet 122A and the pinning ferromagnet 122B are anti-ferromagnetically coupled to each other as shown in the Figure. Pinning ferromagnet has a net magnetization 124 in the negative Z-direction and the pinning ferromagnet 122A has a net magnetization 126 in the positive Z direction.

The pinning ferromagnets 122A and 122B may be designed to have high coercive fields and a high degree of perpendicular magnetic anisotropy. In an embodiment, the pinning ferromagnet 122A includes a layer of a magnetic metal such as Co, Ni, Fe, or alloys of magnetic metals such as Co, Ni, Fe, alloys such as, but not limited to Co—W or Co—Mo, Co—Pt, Co—Pd or Fe—Pt. In other embodiments the pinning ferromagnet 122A includes one or more bilayers having a layer of non-magnetic metal on a layer of magnetic metal such as, but not limited to, Co/Pd, Co/Pt, Co/Ni, Co/W or Co/Mo. In an embodiment, each layer of magnetic material has a thickness between 0.2 nm and 0.8 nm, and each layer of non-magnetic material has at thickness between 0.2 nm and 0.8 nm. The number of bilayers may range between 1-12.

In an embodiment, the pinning ferromagnet 122B includes a layer of a magnetic metal such as Co, Ni, Fe, or alloys of magnetic metals such as Co, Ni, Fe, alloys such as, but not limited to Co—W or Co—Mo, Co—Pt, Co—Pd or Fe—Pt. In other embodiments the pinning ferromagnet 122B includes one or more bilayers having a layer of non-magnetic metal on a layer of magnetic metal such as, but not limited to, Co/Pd, Co/Pt, Co/Ni, Co/W or Co/Mo. In an embodiment, each layer of magnetic material has a thickness between 0.2 nm and 0.8 nm, and each layer of non-magnetic material has at thickness between 0.2 nm and 0.8 nm. The number of bilayers may range between 1-12.

The pinning ferromagnet 122A and the second pinning ferromagnet 122B may each include the same combination of metals/alloy or one or more bilayers, where the thicknesses of each pinning ferromagnet 122A or 122B may be different to provide a difference in the total magnetic anisoptropy of each pinning ferromagnet 122A and 122B. In other examples, the pinning ferromagnet 122A and the pinning ferromagnet 122B may each include a different combination of metals/alloy or one or more bilayers, where the thicknesses of each ferromagnet 122A or 122B may be the same or different.

In an embodiment, the spacer layer 122C includes a ruthenium or an iridium layer nm to provide anti-ferromagnetic coupling between the pinning ferromagnet 122A and the pinning ferromagnet 122B. In some examples, when the spacer layer 122C includes iridium, the iridium spacer layer 122C has a thickness that is approximately 0.5 nm or approximately 1.4 nm. In other examples, when a spacer layer 122C includes ruthenium, the ruthenium spacer layer 122C has a thickness of approximately 0.4 nm or approximately 0.8 nm.

In the illustrative embodiment, the SAF structure 122 includes an additional layer of non-magnetic spacer 122D above the pinning ferromagnet 122B. The additional layer of non-magnetic spacer 122D ferromagnetically couples the ferromagnet 122B with the fixed magnet 106 (not shown in FIG. 1D). The non-magnetic spacer 122D includes a material and has a thickness that can provide ferromagnetic coupling between the fixed magnet 106 and the pinning ferromagnet 122B.

Referring again to FIG. 1A, in an embodiment, tunnel barrier 110 includes a material suitable for allowing electron current having a majority spin to pass through tunnel barrier 110, while impeding, at least to some extent, electron current having a minority spin from passing through tunnel barrier 110. Thus, tunnel barrier 110 (or spin filter layer) may also be referred to as a tunneling layer for electron current of a particular spin orientation. In an embodiment, the tunnel barrier 110 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 110 including MgO has a crystal orientation that is (001) and is lattice matched to fixed magnet 106 below the tunnel barrier 110 and free magnet 108 above tunnel barrier 110. In an embodiment, a free magnet 108 including a $Co_{100-x-y}Fe_xB_y$, is highly lattice matched to the tunnel barrier 110 including an MgO. Lattice matching a crystal structure of the free magnet 108 with the tunnel barrier 110 enables a higher tunneling magnetoresistance (TMR) ratio in the MTJ 104. In an embodiment, tunnel barrier 110 is MgO and has a thickness in the range between 0.9 nm and 2 nm. In exemplary embodiments, where fixed magnet 106 and free magnet 108 include CoFeB, MgO is between 0.9 nm and 1.1 nm.

The memory device 100 may be above a substrate 130, as shown. In an embodiment, the substrate 130 includes a suitable semiconductor material such as but not limited to, single crystal silicon, polycrystalline silicon and silicon on insulator (SOI). In another embodiment, substrate 130 includes other semiconductor materials such as germanium, silicon germanium or a suitable group III-N or a group III-V compound. Logic devices such as MOSFET transistors and access transistors and may be formed on the substrate 130. Logic devices such as access transistors may be integrated with memory devices such as memory device 100 to form embedded memory. Embedded memory including memory devices 100 and logic MOSFET transistors can be combined to form functional integrated circuit such as a system on chip. In an exemplary embodiment, MTJ 104 is a perpendicular MTJ (pMTJ) 104.

Figure 2:
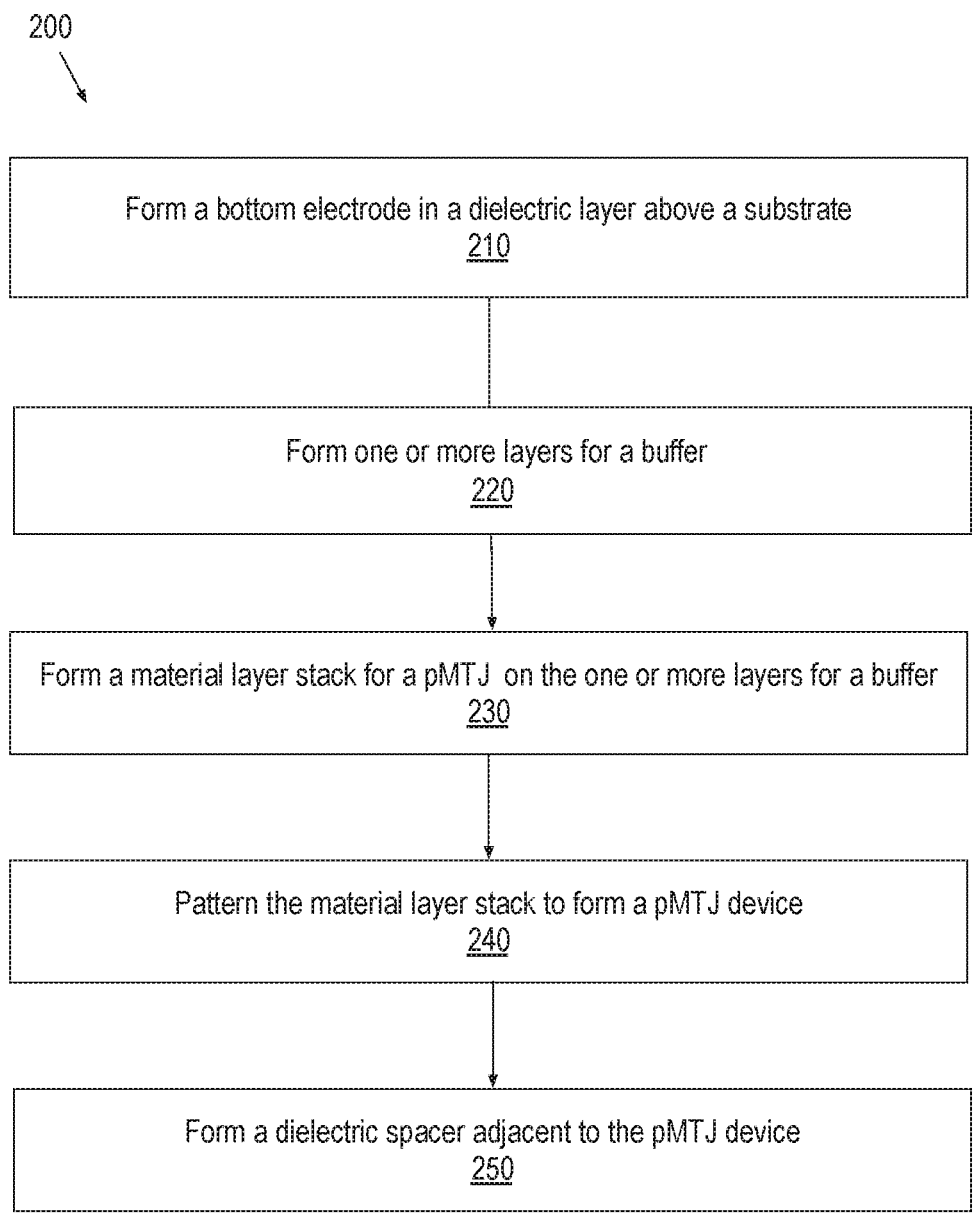
FIG. 2 illustrates a flow diagram of a method to fabricate a memory device.

FIG. 2 illustrates a flow diagram of a method to fabricate a memory device such as the memory device 100. The method 200 begins at operation 210 by forming a bottom electrode above a conductive interconnect formed in a dielectric layer a substrate. The method continues at operation 220 with the formation of bottom electrode and buffer layer having an FCC <111> Ocrystal texture. At operation 230, the method 200 involves formation of layers of an MTJ material layer stack on the buffer layer. At operation 240, the method 200 involves patterning the material layer stack to form a memory device. The method concludes at operation 250 with formation of a dielectric spacer adjacent to sidewalls of the memory device.

FIGS. 3-5C illustrate cross-sectional views representing various operations in a method of fabricating a memory device, substantially similar to a memory device 100, in accordance with embodiments of the present disclosure.

FIG. 3 illustrates a conductive interconnect 300 formed above a substrate 130. In some embodiments, the conductive interconnect 300 is formed in a dielectric layer 302, above a substrate 126, such as is shown. In an embodiment, the conductive interconnect 300 includes a barrier layer 300A and a fill metal 300B. In some examples, the barrier layer 300A includes a material such as tantalum nitride or ruthenium. In some examples, the fill metal 300B includes a material such as cobalt, copper or tungsten. In other examples, the conductive interconnect 300 is fabricated using a subtractive etch process when materials other than copper are utilized. In an embodiment, the dielectric layer 302 includes a material such as but not limited to silicon dioxide, silicon nitride, silicon carbide, or carbon doped silicon oxide. The dielectric layer 302 may have an uppermost surface 302A that is substantially co-planar with an uppermost surface 300C of the conductive interconnect 300, as is illustrated. In some embodiments, conductive interconnect 300 is electrically connected to a separate circuit element such as a transistor (not shown).

FIG. 4 illustrates the structure of FIG. 3 following the formation of one or more layers for an electrode 400 on the conductive interconnect 300 and over the dielectric layer 302. The process may include formation of a bottom electrode layer 402. In an embodiment, the bottom electrode layer 402 is formed by depositing a layer of conductive metal or a conductive alloy. The deposition process may include blanket deposition of the of conductive metal or a conductive alloy on the conductive interconnect 300 and over the dielectric layer 302. The process may include physical vapor deposition or chemical vapor deposition methods.

A buffer layer 404 is formed on the bottom electrode layer 402. In an embodiment, the buffer layer 404 is formed by co-sputtering tungsten and ruthenium onto the bottom electrode layer 402. Depending on the material composition desired, the atomic percent of tungsten and ruthenium can be controlled during the deposition process. The atomic percent of tungsten and ruthenium can be varied during the deposition process to create an alloy having a gradient in the constituents of the alloy.

In a second embodiment, buffer layer 404 is formed by a deposition process where a thin layer of Ru is deposited onto a thin layer of tungsten, and where the deposition process is continued until a plurality of alternating layers of W and Ru are formed. The resulting material layer stack can be annealed to diffuse and intermix the W and the Ru forming the buffer layer 404. In some such embodiments, the layer of tungsten is between 0.05 nm and 1 nm, and the layer of ruthenium is between 0.05 nm and 1 nm.

In a third embodiment, buffer layer 404 is formed by sputtering an alloyed material from a Ru—W alloy target. In an embodiment, each Ru—W alloy target may have a particular relative atomic percent of W and Ru. In some embodiments, multiple Ru—W alloy targets each with different relative atomic percent of W and Ru may be utilized to deposit a plurality of alloy layers.

In a fourth embodiment, the buffer layer 404 is a bilayer, where the bilayer includes a first layer including tantalum on the bottom electrode layer 402, and a second layer including ruthenium on the layer of tantalum. The first layer may have a thickness between 0.2 nm and 5 nm and the second layer may have a thickness between 0.5 nm and 5 nm. In some embodiments the buffer layer 404 may include a Ta/Ru/Ta/Ru multilayer.

In one or more embodiments, deposition of the buffer layer 404 may begin by first depositing a layer of predominantly tungsten and then forming buffer layer 404 on the layer of predominantly tungsten. In some such embodiments, the deposition process further includes depositing a layer of ruthenium on the buffer layer 404, where the ruthenium has a thickness less than 0.5 nm. In or more of the embodiments, the buffer layer 404 has a thickness between 0.5 nm and 10 nm.

A conductive layer 406 is formed on the buffer layer 404. In an embodiment, as discussed above, the alloying of W and Ru changes the crystallographic texture of the buffer layer 404, compared to a layer of predominantly Ru or predominantly W. The crystallographic texture of the buffer layer 404 may enable an iridium conductive layer 406 to be grown with an FCC <111> crystal texture. The iridium conductive layer 406 may be deposited to a thickness between 0.5 nm-5 nm. In another embodiment, the conductive layer 406 includes platinum. The platinum conductive layer 406 may be deposited to a thickness between 0.5 nm-5 nm.

Figure 5A:
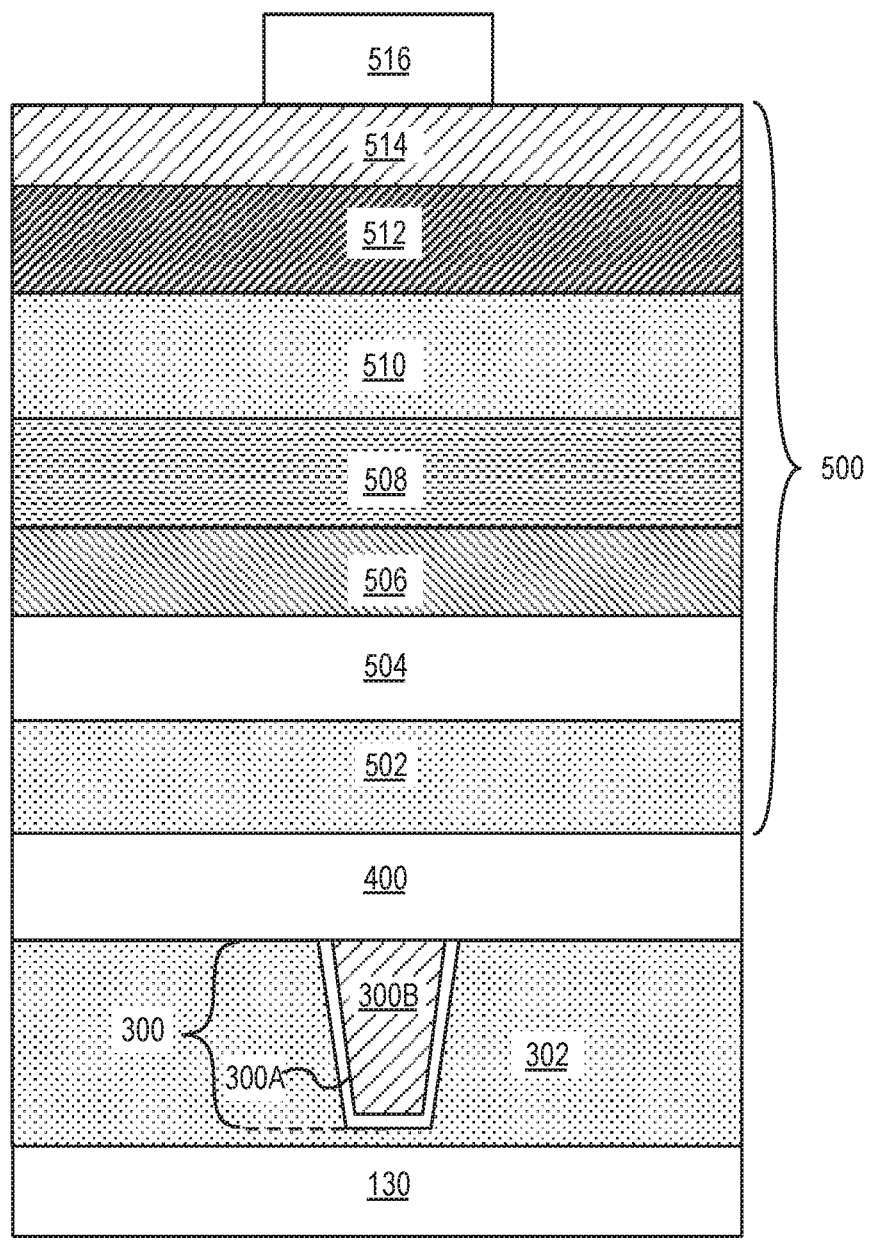
FIG. 5A illustrates a cross-sectional view of the structure in FIG. 4 following the formation of plurality of layers in a material layer stack for a memory device, followed by a mask on the material layer stack.
Figure 5A:
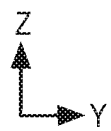

FIG. 5A illustrates a cross-sectional view of the structure in FIG. 4 following the formation of layers in a material layer stack 500 for a memory device.

In an embodiment, the deposition process continues (after formation of the conductive layer 406) where one or more layers in a SAF structure 502 are deposited on the conductive layer 406. In some embodiments, one or more layers in a SAF structure 502 are sequentially blanket deposited on the conductive layer 406 using a PVD process. In the illustrative embodiment, the one or more layers in a SAF structure 502 are the same as the layers in SAF structure 118, described above.

The deposition process continues with formation of a fixed magnetic material 504 on the one or more layers in a SAF structure 502. In an embodiment, the fixed magnetic material 504 an alloy of cobalt, iron and boron using an alloy target in a sputter deposition toolset. In an embodiment, the deposition process includes a physical vapor deposition (PVD) or a plasma enhanced chemical vapor deposition (PECVD) process. In an embodiment, the PVD deposition process includes an RF or a DC sputtering process. In other embodiments, fixed magnetic material 504 includes materials that are the same or substantially the same as the fixed magnet 106.

The deposition process continues with formation of a tunnel barrier layer 506 is blanket deposited on fixed magnetic material 504. In an embodiment, the tunnel barrier layer 506 includes magnesium and oxygen or aluminum and oxygen. In an exemplary embodiment, the tunnel barrier layer 506 includes magnesium and oxygen, and is deposited using a reactive sputter deposition process. In an embodiment, the reactive sputter process is carried out at room temperature. In another embodiment, the reactive sputter process is carried out at a temperature between 25-350 degrees Celsius. In an embodiment, the tunnel barrier layer 506 is deposited to a thickness between 0.8 nm to 3 nm. In some examples, the deposition process is carried out in a manner that yields a tunnel barrier layer 506 having an amorphous structure. In some such examples, the amorphous tunnel barrier layer 506 becomes crystalline after performing a high temperature anneal process to be described further below. In other embodiments, the tunnel barrier layer 506 is crystalline as deposited.

In an embodiment, a layer of free magnetic material 508 is blanket deposited on an uppermost surface of the tunnel barrier layer 419. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the free magnetic material 508 is $Co_{100-y}Fe_xB_y$, where X and Y each represent atomic percent, further where X is between 50-80 and Y is between 10-30, and further where the sum of X and Y is less than 100. In some embodiments, the free magnetic material 508 includes a material that is the same or substantially the same as the material of the fixed magnet 106 described above. In some examples, the free magnetic material 508 may be deposited to a thickness between 0.9 nm and 2.5 nm. A thickness range between 0.9 nm and 2.5 nm may be sufficiently thin to provide perpendicular magnetic anisotropy required to fabricate a perpendicular MTJ. In an embodiment, a dopant species is introduced during a final stage of the deposition process. The concentration of the dopant species is gradually increased during the stages of the deposition process. In an exemplary embodiment, the free magnetic material 508 has a chemical composition $Co_{100-y}Fe_xB_y$ for over 80% of a thickness of the free magnetic material 508 deposited and a chemical composition $(Co_{100-y}Fe_xB_y)_{1-A}D_A$, where D is the dopant species, and A is the atomic percent of the dopant species.

The fabrication process is continued with deposition of a graded capping layer 510 on the free magnetic material 508. In an embodiment, the graded capping layer 510 is blanket deposited onto the surface of the free magnetic material 508 by a PVD process or a sputter deposition process. In an embodiment, a dopant species is introduced during the deposition process, where the concentration of the dopant species is gradually increased during the process. In an embodiment, the graded capping layer 510 has a chemical composition $(Co_{100-x-y}Fe_xB_y)_{1-A}D_A$, where D is the dopant species, and A is the atomic percent of the dopant species. In some embodiments, A is at least 30 at the beginning of the deposition and reaches a maximum of 100 at the final stages of the deposition process. In other embodiments, the dopant concentration is controlled so that the maximum variation in dopant species is 30 atomic percent throughout the deposition process. In some such embodiments, the min dopant concentration A is at least 30 atomic percent at the beginning and varies by as much as 30 atomic percent over the entire deposition process. For example, the range may vary between 30 atomic percent and 60 atomic percent, or between 50 atomic percent and 80 atomic percent, etc. The graded capping layer 510 may be deposited to a thickness of at least 0.8 nm and as much as 25 nm. It is to be appreciated that the thinner the graded capping layer 510, the larger the gradient in the dopant species.

In an embodiment, one or more layers in a capping layer 512 are blanket deposited on the surface of the graded capping layer 510. In an embodiment, the capping layer 512 is deposited by a PVD or a CVD process. In an embodiment, the capping layer 512 includes one or more metallic species such as but not limited to Ta, W or Mo. The capping layer 512 may include an alloy of different metallic elements or a single metallic species. In other embodiments, the capping layer 512 includes a material of the dopant species in the graded capping layer 510. For example, the capping layer 512 may include a single elemental species of Mo, W or Ta and the graded capping layer 510 includes the same single elemental species of Mo, W or Ta. In other embodiments, graded capping layer 510 includes a single dopant species described above and the capping layer 512 includes at least the dopant species of the graded capping layer 510 in addition to any other metallic species. In other embodiments, the capping layer 512 includes a single metallic species that is different from the dopant species in the graded capping layer 510.

It is to be appreciated that material of the capping layer 512 may be the same as the dopant species in the free magnetic material 508 and the dopant species in the graded capping layer 510. In other embodiments, the material of the capping layer 512 includes at least one species that is the same as the as the dopant species in the free magnetic material 508 and the dopant species in the graded capping layer 510. In yet another embodiment, the material of the capping layer 512 is different from the dopant species in the graded capping layer 510 and dopant in the free magnetic material 508.

The deposition process concludes with the formation of a top electrode layer 514 on the capping layer 512. The top electrode layer 514 includes a suitable material to provide a hardmask for etching the material layer stack 500. In an embodiment, the top electrode layer 514 includes one or more layers of material such as Ta, Ru, TaN or TiN. In an embodiment, an as deposited thickness of the top electrode layer 514 ranges between 5 nm and 70 nm.

In an embodiment, after all the layers in the material layer stack 500 are deposited, an anneal is performed. In an embodiment, the anneal process enables formation of a crystalline alloy of one or more of Co, Fe or B in the free magnetic material 508 and in the fixed magnetic material 504. In an embodiment, the anneal is performed immediately post deposition but before forming a mask 516 on the top electrode layer 514. A post-deposition anneal of the material layer stack 500 is carried out in a furnace at a temperature between 350-430 degrees Celsius in a vacuum environment. In an embodiment, the annealing process promotes solid phase epitaxy of the free magnetic material 508 to follow a crystalline template of the adjacent tunnel barrier layer 506 (e. g., MgO). In an embodiment, the anneal also promotes solid phase epitaxy of the fixed magnetic material 504 to follow a crystalline template of the adjacent tunnel barrier layer 506 (e. g., MgO) <001> Lattice matching between the tunnel barrier layer 506 and the fixed magnetic material 504 and <001> lattice matching between the tunnel barrier layer 506 and the free magnetic material 508 enables a TMR ratio of at least 100% to be obtained in the material layer stack 500.

In an embodiment, the mask 516 defines a shape and size of a memory device and a location where the memory device is to be subsequently formed with respect the conductive interconnect 300. In some embodiments, the mask 516 is formed by a lithographic process. In other embodiments, the mask 516 includes a dielectric material that has been patterned.

Figure 5B:
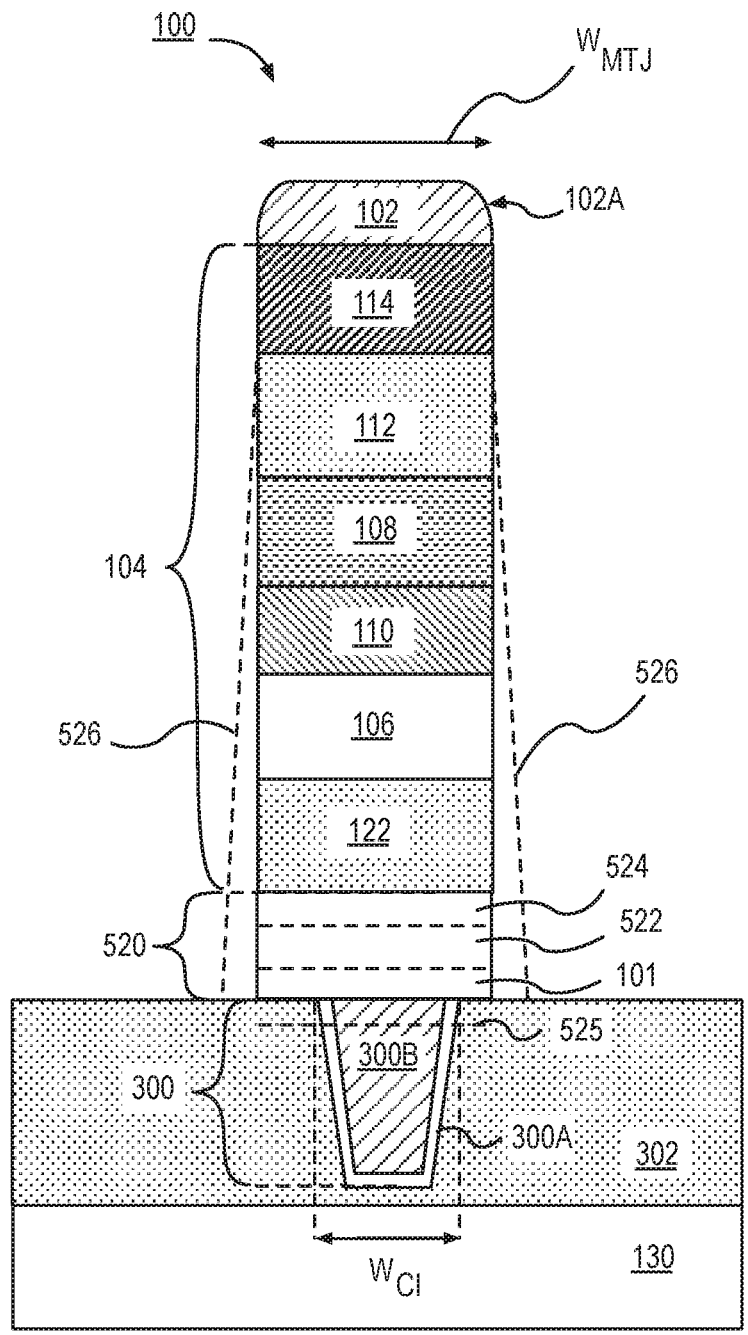
FIG. 5B illustrates a cross-sectional view of the structure in FIG. 5A following the patterning of the material layer stack to form a memory device.

FIG. 5B illustrates a cross-sectional view of the structure in FIG. 3C following the patterning of the material layer stack 500.

In an embodiment, the plasma etch process is utilized to pattern the material layer stack 500 to form a memory device 100. The plasma etch process etches the various layers in the material layer stack 500 to form top electrode 102, conductive layer 112, free magnet 108, tunnel barrier 110, fixed magnet 106, SAF structure 122 and bottom electrode structure 520. In the illustrative embodiment, the bottom electrode structure 520 includes bottom electrode 101, and patterned buffer layer 522 and patterned conductive layer 524.

In an embodiment, the memory device 100 has a width, $W_{MTJ}$, that is greater than a width $W_{CI}$ of the conductive interconnect 300, as shown. In one such embodiment, the plasma etch process exposes the dielectric layer 302, when the memory device 100 is formed. In an embodiment, where the memory device 100 has a width, $W_{MTJ}$, that is greater than the width $W_{CI}$ of the conductive interconnect 300, the plasma etch process exposes portions of the conductive interconnect 300. In embodiments where $W_{MTJ}$ is less than $W_{CI}$, conductive interconnect 300 may include a cap across a top portion (above dashed line 525, adjacent to the dielectric material 302). A cap across the top portion of the conductive interconnect 300 may prevent exposure of the liner layer 300A and the fill metal 300B. A cap may be highly desirable when the fill metal 300B includes copper.

In some embodiments, depending on the etch parameters, and thickness of the various magnetic layers, the memory device 100 may have sidewalls that are tapered as indicated by the dashed lines 526. In other embodiments the plasma etch process may erode mask utilized to pattern the memory device 100 and erode corners of the top electrode 102. In one such embodiment, the top electrode 102 has a top surface 102A that may have corners that are rounded, as shown in FIG. 5B.

In an exemplary embodiment, the memory device 100 formed over the conductive interconnect 300, constitutes a memory device 100 with a perpendicular magnetic tunnel junction (pMTJ) 104.

Figure 5C:
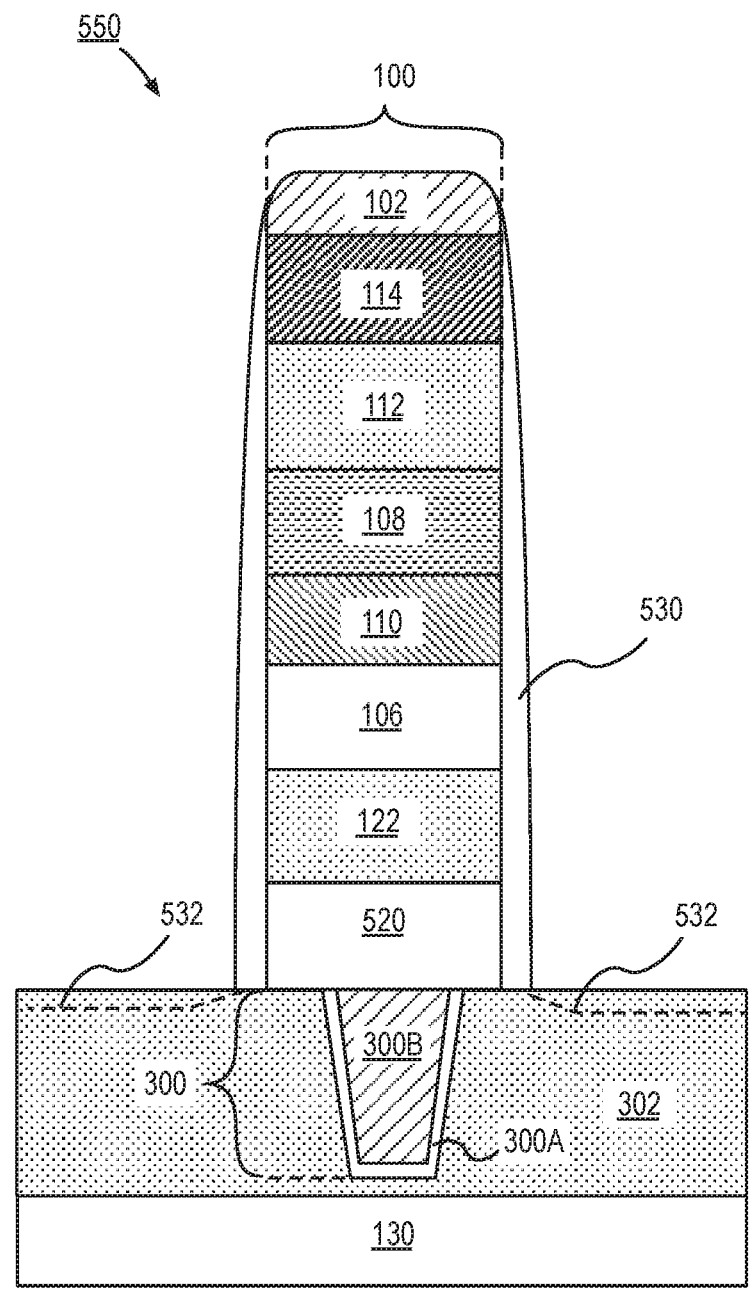
FIG. 5C illustrates a cross-sectional view of the structure in FIG. 5B following the formation of a dielectric spacer adjacent to the memory device.

FIG. 5C illustrates a cross-sectional view of the structure in FIG. 3D following the formation of a dielectric spacer 530 adjacent to the memory device 100. In an embodiment, a dielectric spacer layer is deposited on the memory device 100 and on the uppermost surface of the dielectric 302. In examples, when $W_{MTJ}$ is less than $W_{CI}$, the dielectric layer may be also deposited on a portion of a top surface of the conductive interconnect 300 (or on a top surface of a cap discussed in association with FIG. 5B). In an embodiment, the dielectric spacer layer is deposited without a vacuum break following the plasma etch process to prevent oxidation of magnetic layers in the memory device 100. In an embodiment, the dielectric spacer layer includes silicon and one or more of nitrogen or carbon. Absence of oxygen in the spacer layer may help minimize oxidation of magnetic layers. In an embodiment, the dielectric spacer layer is etched by a plasma etch process forming dielectric spacer 530 on sidewalls of the memory device 100. In some embodiments, the dielectric spacer 530 includes materials that are similar or substantially similar to the dielectric 302. In such embodiments, portions of the dielectric 302 may be recessed as indicated by dashed lines 532.

The structure of FIG. 5C including the dielectric spacer 530 on sidewalls of the memory device 100 is herein referred to as memory device 550.

Figure 6:
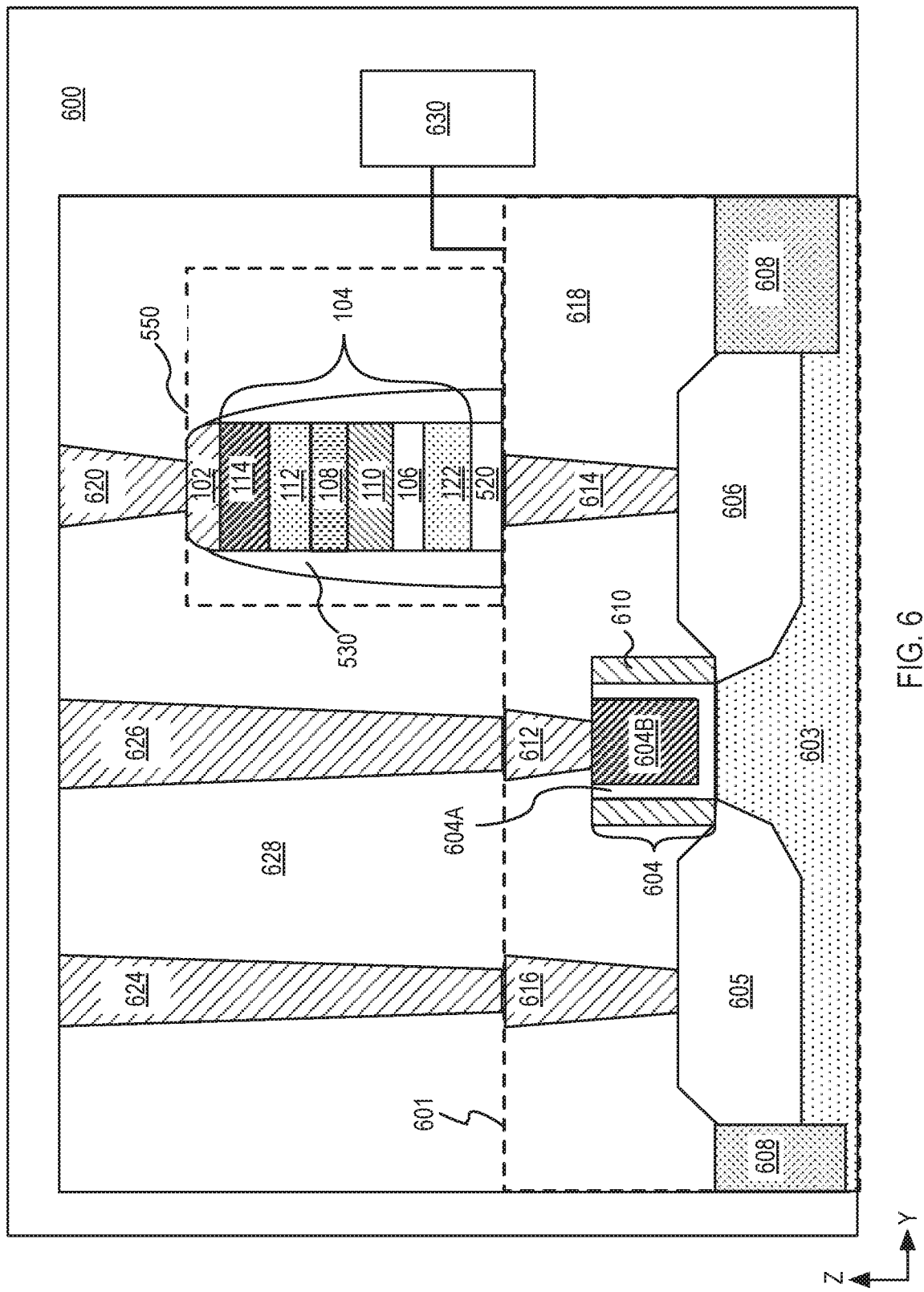
FIG. 6 illustrates a cross-sectional view of a memory device coupled to a transistor.

FIG. 6 illustrates a system 600 which includes a memory device such as memory device 550 coupled to an access transistor 601. In an embodiment, the transistor 601 is on a substrate 603 and has a gate 604, a source region 605, and a drain region 606. In the illustrative embodiment, an isolation 608 is adjacent to the source region 605, drain region 606 and portions of the substrate 603. In some implementations of the disclosure, such as is shown, a pair of sidewall spacers 610 are on opposing sides of the gate 604.

The transistor 601 further includes a gate contact 612 above and electrically coupled to the gate 604, and a drain contact 614 above and electrically coupled to the drain region 606, and a source contact 616 above and electrically coupled to the source region 605, as is illustrated in FIG. 6. The transistor 601 also includes dielectric 618 adjacent to the gate 604, source region 605, drain region 606, isolation 608, sidewall spacers 610, gate contact 612, drain contact 614 and source contact 616.

In an embodiment, the memory device 550 is a perpendicular memory device 550 with one or more structural and material properties described above in FIG. 5. Referring again to FIG. 6, the device 550 includes an electrode structure 520, an electrode 102 above electrode 101 and a magnetic tunnel junction (MTJ) 104 between the electrode 101 and the electrode structure 520. The memory device 550 further includes magnet 108 and a tunnel barrier 110 between the magnet 106 and the magnet 108. The memory device 550 further includes a conductive layer 112 between the free magnet 108 and the electrode 102, where the conductive layer 112 includes a metallic dopant. The metallic dopant has a concentration that increase with distance from an interface between the magnet 108 and the conductive layer 112. A capping layer 114 is between the conductive layer 112 and the electrode 102. The memory device 550 further includes a dielectric spacer 530 adjacent to the magnetic tunnel junction (MTJ) 104.

An MTJ interconnect 620, is coupled with the electrode 102 as shown. MTJ interconnect 620 may be connected to one or more circuit elements. The memory device is above and coupled with drain contact 614 adjacent to dielectric 618. In the illustrative embodiment, a portion of the electrode structure 520 is in electrical contact with a drain contact 614 of transistor 601. In other embodiments, there are one or more additional interconnect structures between drain contact 614 and memory device 550.

Gate contact 612 and source contact 616 are each coupled with interconnects. In the illustrative embodiment, gate contact 612 is coupled with a gate interconnect 626 and the source contact 616 is coupled with a source interconnect 624. A dielectric 628 is adjacent to source interconnect 624, gate interconnect 624, memory device 550, source contact 616 and gate contact 612. In an embodiment, the system 600 further includes a power supply 630 coupled to the transistor 601.

In an embodiment, the underlying substrate 603 represents a surface used to manufacture integrated circuits. Suitable substrate 603 includes a material such as single crystal silicon, polycrystalline silicon and silicon on insulator (SOI), as well as substrates formed of other semiconductor materials. In some embodiments, the substrate 603 is the same as or substantially the same as the substrate 130. The substrate 603 may also include semiconductor materials, metals, dielectrics, dopants, and other materials commonly found in semiconductor substrates.

In an embodiment, the transistor 601 associated with substrate 603 are metal-oxide-semiconductor field-effect transistors (MOSFET or simply MOS transistors), fabricated on the substrate 603. In some embodiments, the transistor 601 is an access transistor 601. In various implementations of the disclosure, the transistor 601 may be planar transistors, nonplanar transistors, or a combination of both. Nonplanar transistors include FinFET transistors such as double-gate transistors and tri-gate transistors, and wrap-around or all-around gate transistors such as nanoril6on and nanowire transistors.

In some embodiments, gate 604 includes at least two layers, a gate dielectric layer 604A and a gate electrode 604B. The gate dielectric layer 604A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 604A to improve its quality when a high-k material is used.

The gate electrode 604B of the access transistor 601 of substrate 603 is formed on the gate dielectric layer 604A and may consist of at least one P-type work function metal or N-type work function metal, depending on whether the transistor is to be a PMOS or an NMOS transistor. In some implementations, the gate electrode 604B may consist of a stack of two or more metal layers, where one or more metal layers are work function metal layers and at least one metal layer is a conductive fill layer.

For a PMOS transistor, metals that may be used for the gate electrode 604B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 604B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 604B may consist of one or more U-shaped metal layers formed atop one or more planar, non-U-shaped layers.

The sidewall spacers 610 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 605 and drain region 606 are formed within the substrate adjacent to the gate stack of each MOS transistor. The source region 605 and drain region 606 are generally formed using either an implantation/diffusion process or an etching/deposition process. In the former process, dopants such as boron, aluminum, antimony, phosphorous, or arsenic may be ion-implanted into the substrate to form the source region 605 and drain region 606. An annealing process that activates the dopants and causes them to diffuse further into the substrate typically follows the ion implantation process. In the latter process, the substrate 603 may first be etched to form recesses at the locations of the source and drain regions. An epitaxial deposition process may then be carried out to fill the recesses with material that is used to fabricate the source region 605 and drain region 606. In some implementations, the source region 605 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 605 and drain region 606 may be formed using one or more alternate semiconductor materials such as germanium or a group III-V material or alloy. And in further embodiments, one or more layers of metal and/or metal alloys may be used to form the source region 605 and drain region 606.

In an embodiment, the source contact 616, the drain contact 614 and gate contact 612 each include a multi-layer stack. In an embodiment, the multi-layer stack includes one or more of Ti, Ru or Al and a conductive cap on the one or more of Ti, Ta, Ru or Al. The conductive cap may include a material such as W or Cu.

In an embodiment, the source interconnect 624, gate interconnect 626, MTJ interconnect 620 each include a multi-layer stack. In an embodiment, the multi-layer stack includes one or more of Ti, Ru or Al and a conductive cap on the one or more of Ti, Ta, Ru or Al. The conductive cap may include a material such as W or Cu.

The isolation 608 and dielectric 618 and 628 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 7:
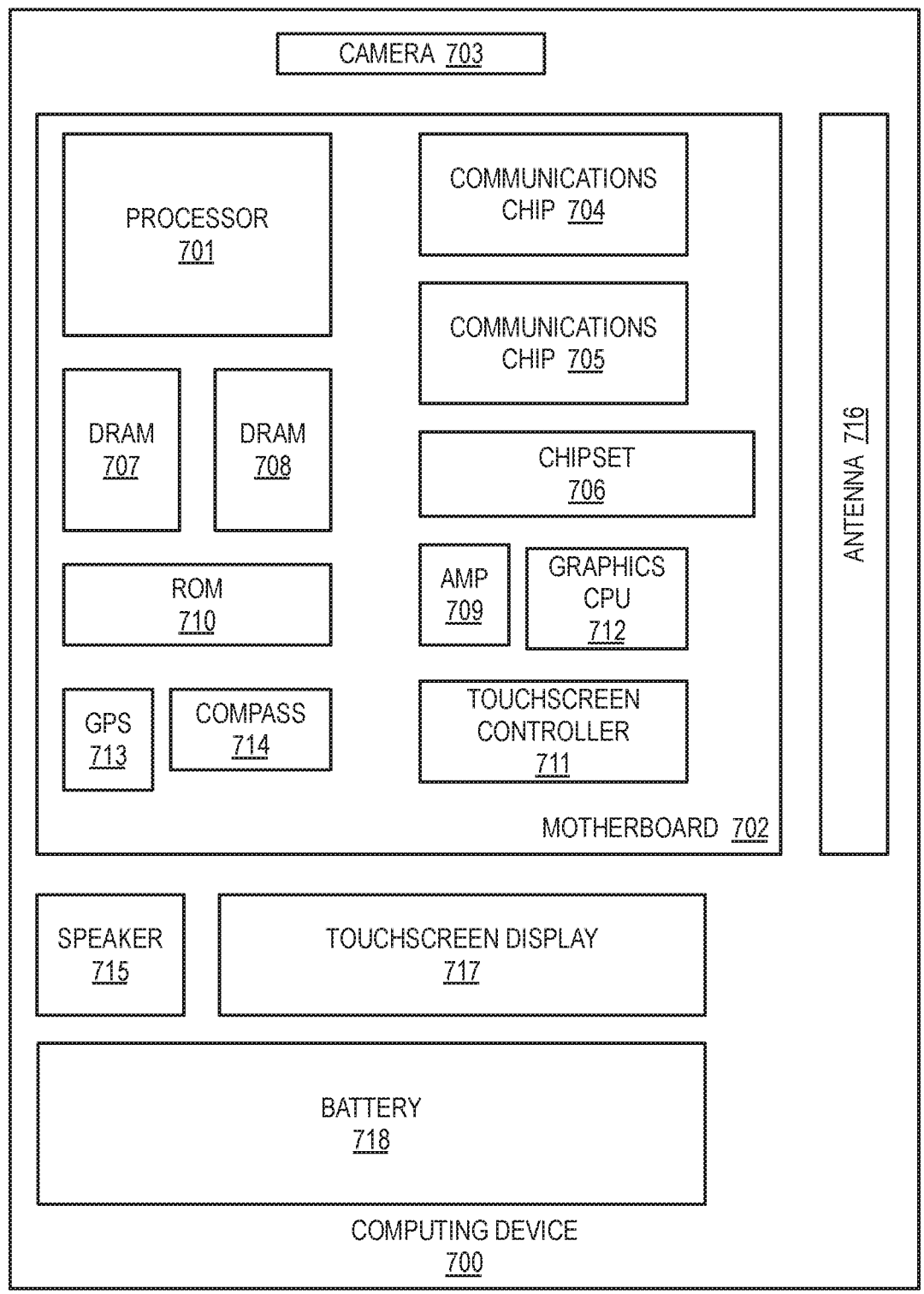
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communications chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more transistors, interconnect structures, and non-volatile memory devices such as transistor 601 coupled with memory device 550, respectively (described in FIG. 6). The term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 705 includes one or more transistors, interconnect structures, and non-volatile memory devices such as transistor 601, source interconnect 624, gate interconnect 626, MTJ interconnect 620 and memory device 550, respectively (described in FIG. 6). Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of NVM devices including one or more memory devices 550 coupled with transistor 601 (described in FIG. 6).

In various implementations, the computing device 700 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
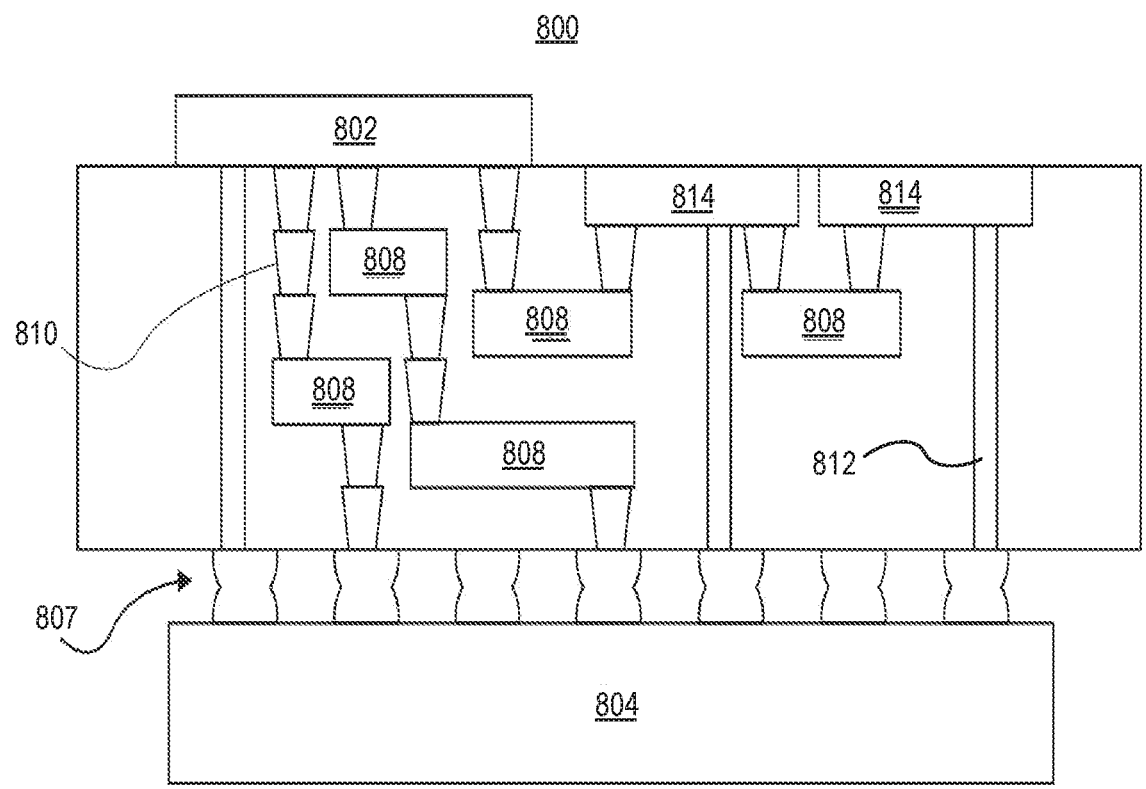
FIG. 8 illustrates an integrated circuit (IC) structure that includes one or more embodiments of the present disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide.

In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 812. The integrated circuit (IC) structure 800 may further include embedded devices 814, including both passive and active devices. Such embedded devices 814 include capacitors, decoupling capacitors, resistors, inductors, fuses, diodes, transformers, device structure including transistors, such as transistor 601 coupled with a with one at least one nonvolatile memory device such as memory device 550 (such as described in FIG. 6). Referring again to FIG. 8, the integrated circuit (IC) structure 800 may further include embedded devices 814 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered.

Thus, one or more embodiments of the present disclosure relate to the fabrication of a perpendicular magnetic tunnel junction-based memory device such as the memory device 100 or memory device 550 (described in association with FIG. 1A and FIG. 5C respectively). The memory device 100 or memory device 550 (described in association with FIG. 1A and FIG. 5C respectively) may be used in embedded non-volatile memory applications.

In a first example, a memory device includes a first electrode, a second electrode and a magnetic tunnel junction (MTJ) between the first electrode and the second electrode. The MTJ includes a fixed magnet, a free magnet and a tunnel barrier between the fixed magnet and the free magnet. The MTJ further includes a conductive layer between the free magnet and the second electrode, the conductive layer having a metallic dopant, where the metallic dopant has a concentration that increase with distance from an interface between the free magnet and the conductive layer. A capping layer is between the conductive layer and the second electrode.

In second examples, for any of first examples, the conductive layer is non-magnetic. In third examples, for any of the first through second examples, the conductive layer includes iron and one or more of cobalt or boron.

In fourth examples, for any of the first through third examples, the conductive layer includes iron, cobalt and boron and the free magnet includes cobalt, iron and boron, where the atomic percent of the cobalt, iron and boron in the free magnet is substantially the same as the atomic percent of cobalt, iron and boron in the conductive layer.

In fifth examples, for any of the first through fourth examples, the metallic dopant includes tungsten, molybdenum or tantalum.

In sixth examples, for any of the first through fifth examples, the metallic dopant concentration is at least 30 atomic percent at the interface with the free magnet.

In seventh examples, for any of the first through sixth examples, the metallic dopant reaches a maximum of 100 atomic percent at an interface between the conductive layer and the capping layer.

In eighth examples, for any of the first through seventh examples, the concentration varies by at least 30 atomic percent within the conductive layer.

In ninth examples, for any of the first through eighth examples, the metallic dopant is a first metallic dopant and the free magnet further includes a second metallic dopant and where the second metallic dopant has a concentration that is between 0 and 20 atomic percent of the composition of the free magnet.

In tenth examples, for any of the first through ninth examples, the second metallic dopant is uniformly distributed throughout an entire volume of the free magnet.

In eleventh examples, for any of the first through tenth examples, the second metallic dopant is the same as the first metallic dopant.

In twelfth examples, for any of the first through eleventh examples, the conductive layer has a vertical thickness as measured from an interface between the free magnet and the conductive layer, where the vertical thickness is between 0.8 nm and 25 nm.

In thirteenth examples, for any of the first through twelfth examples, the free magnet has a vertical thickness as measured from an interface between the free magnet and the tunnel barrier, where the vertical thickness is between 0.8 nm and 2.5 nm.

In fourteenth examples, for any of the first through thirteenth examples, the capping layer includes one or more of tantalum, ruthenium, molybdenum or tungsten.

In fifteenth examples, for any of the first through fourteenth examples, the capping layer includes a same metal as a metal of the dopant.

In sixteenth examples, for any of the first through fifteenth examples, the capping layer has a thickness as measured from an interface between the capping layer and the conductive layer, where the thickness is between 2 nm and 10 nm.

In seventeenth examples, method of fabricating a memory device includes forming a bottom electrode layer, forming a material layer stack on the bottom electrode layer. Forming the bottom electrode layer includes forming a fixed magnetic layer above the bottom electrode layer and forming a tunnel barrier layer on fixed magnetic layer. The method further includes forming a free magnetic layer on the tunnel barrier layer and forming a conductive layer on the free magnetic layer, where the forming includes doping the conductive layer with a non-magnetic metal. The method further includes forming a capping layer on the conductive layer, forming a top electrode layer on the capping layer and etching the material layer stack and the bottom electrode layer to form a memory device.

In eighteenth examples, for any of the seventeenth examples, forming the conductive layer includes co-sputter depositing cobalt, iron, boron and a dopant species.

In nineteenth examples, for any of the seventeenth through eighteenth examples, forming the conductive layer includes increasing the density of dopant species during the deposition process and decreasing the density of the cobalt, iron and boron.

In twentieth example, a system includes a transistor above a substrate, the transistor includes a drain contact coupled to a drain, a source contact coupled to a source, a gate contact coupled to a gate and a bottom electrode coupled to the drain contact. A memory device is coupled with the drain contact. The memory device includes a first electrode, a second electrode and a magnetic tunnel junction (MTJ) between the first electrode and the second electrode. The MTJ includes a fixed magnet, a free magnet and a tunnel barrier between the fixed magnet and the free magnet. The MTJ further includes a conductive layer between the free magnet and the second electrode, the conductive layer having a metallic dopant, where the metallic dopant has a concentration that increase with distance from an interface between the free magnet and the conductive layer. A capping layer is between the conductive layer and the second electrode.

In twenty-first examples, for any of the twentieth example, the bottom electrode is above the drain contact, the fixed magnet is above the bottom electrode, the tunnel barrier is above the fixed magnet and the free magnet is above the tunnel barrier.

In twenty-first examples, for any of the twentieth through twenty-first examples, the system further includes a power supply coupled to the transistor.

What is claimed is:

1. A memory device, comprising:
   a first electrode;
   a second electrode; and
   a magnetic tunnel junction (MTJ) between the first electrode and the second electrode, the MTJ comprising:
   a fixed magnet;
   a free magnet;
   a tunnel barrier between the fixed and the free magnets;
   a conductive layer between the free magnet and the second electrode, the conductive layer comprising a metallic dopant, wherein the metallic dopant has a concentration that increases with distance from an interface between the free magnet and the conductive layer; and
   a capping layer between the conductive layer and the second electrode.

2. The memory device of claim 1, wherein the conductive layer is non-magnetic.

3. The memory device of claim 1, wherein the conductive layer comprises iron, and one or more of cobalt or boron.

4. The memory device of claim 1, wherein the conductive layer comprises iron, cobalt and boron and the free magnet comprises cobalt, iron and boron, wherein the atomic percent of the cobalt, iron and boron in the free magnet is substantially the same as the atomic percent of cobalt, iron and boron in the conductive layer.

5. The memory device of claim 1, wherein the metallic dopant comprises tungsten, molybdenum or tantalum.

6. The memory device of claim 1, wherein the metallic dopant concentration is at least 30 atomic percent at the interface with the free magnet.

7. The memory device of claim 1, wherein the concentration varies by at least 30 atomic percent within the conductive layer.

8. The memory device of claim 1, wherein the metallic dopant is a first metallic dopant and the free magnet further comprises a second metallic dopant and wherein the second metallic dopant has a concentration between 0 and 20 atomic percent of the composition of the free magnet.

9. The memory device of claim 1, wherein the conductive layer has a vertical thickness as measured from an interface between the free magnet and the conductive layer, where the vertical thickness is between 0.8 nm and 25 nm.

10. The memory device of claim 1, wherein the free magnet has a vertical thickness as measured from an interface between the free magnet and the tunnel barrier, where the vertical thickness is between 0.8 nm and 2.5 nm.

11. The memory device of claim 1, wherein the capping layer includes one or more of tantalum, ruthenium, molybdenum or tungsten.

12. The memory device of claim 1, wherein the capping layer includes a same metal as a metal of the metallic dopant.

13. The memory device of claim 1, wherein the capping layer has a thickness as measured from an interface between the capping layer and the conductive layer, wherein the thickness is between 2 nm and 10 nm.

14. The memory device of claim 6, wherein the metallic dopant reaches a maximum of 100 atomic percent at an interface between the conductive layer and the capping layer.

15. The memory device of claim 8, wherein the second metallic dopant is uniformly distributed throughout an entire volume of the free magnet.

16. The memory device of claim 8, wherein the second metallic dopant is the same as the first metallic dopant.

17. A method of fabricating a memory device, the method comprising:
   forming a bottom electrode layer;
   forming a material layer stack on the bottom electrode layer, the forming comprising:
      forming a fixed magnetic layer above the bottom electrode layer;
      forming a tunnel barrier layer on fixed magnetic layer;
      forming a free magnetic layer on the tunnel barrier layer;
      forming a conductive layer on the free magnetic layer, wherein the forming comprises doping the conductive layer with a non-magnetic metal;
      forming a capping layer on the conductive layer; and
      forming a top electrode layer on the capping layer; and
   etching the material layer stack and the bottom electrode layer to form a memory device.

18. The method of claim 17, wherein forming conductive layer comprises co-sputter depositing cobalt, iron, boron and a dopant species.

19. The method of claim 18, wherein forming conductive layer comprises increasing the density of dopant species during the deposition process and decreasing the density of the cobalt, iron and boron.

20. A system, comprising:
   a transistor above a substrate, the transistor comprising:
      a drain contact coupled to a drain;
      a source contact coupled to a source;
      a gate contact coupled to a gate; and
      a bottom electrode coupled to the drain contact; and
   a memory device, coupled with the drain contact, the memory device comprising:
      a first electrode;
      a second electrode; and
      a magnetic tunnel junction (MTJ) between the first electrode and the second electrode, the MTJ including:
         a fixed magnet;
         a free magnet;
         a tunnel barrier between the fixed and the free magnets;
         a conductive layer between the free magnet and the second electrode, the conductive layer including a metallic dopant, where the metallic dopant has a concentration that increases with distance from an interface between the free magnet and the conductive layer; and
         a capping layer between the conductive layer and the second electrode.

21. The system of claim 20, wherein the bottom electrode is above the drain contact, and wherein the fixed magnet is above the bottom electrode, the tunnel barrier is above the fixed magnet and the free magnet is above the tunnel barrier.

22. The system of claim 20, further comprising a power supply coupled to the transistor.

* * * * *